United States Patent
McMullen et al.

(10) Patent No.: US 10,161,994 B2
(45) Date of Patent: Dec. 25, 2018

(54) SYSTEMS AND METHODS FOR ELECTRICALLY TESTING ELECTROMIGRATION IN AN ELECTROMIGRATION TEST STRUCTURE

(71) Applicant: Cascade Microtech, Inc., Beaverton, OR (US)

(72) Inventors: Timothy Allen McMullen, Lino Lakes, MN (US); Brent Dale Harry, White Bear Lake, MN (US); Eric James Wilcox, Andover, MN (US); James J. Donlin, Cottage Grove, MN (US)

(73) Assignee: FormFactor Beaverton, Inc., Beaverton, OR (US)

( * ) Notice: Subject to any disclaimer, the term of this patent is extended or adjusted under 35 U.S.C. 154(b) by 156 days.

(21) Appl. No.: 15/181,909

(22) Filed: Jun. 14, 2016

(65) Prior Publication Data

US 2017/0356957 A1    Dec. 14, 2017

(51) Int. Cl.
*G01R 31/28*    (2006.01)

(52) U.S. Cl.
CPC .................. *G01R 31/2858* (2013.01)

(58) Field of Classification Search
None
See application file for complete search history.

(56) References Cited

U.S. PATENT DOCUMENTS

| | | | |
|---|---|---|---|
| 5,057,441 A * | 10/1991 | Gutt | G01R 31/275 257/E21.525 |
| 5,533,197 A | 7/1996 | Moran et al. | |
| 6,037,795 A * | 3/2000 | Filippi | G01R 31/2853 324/762.01 |
| 6,040,610 A * | 3/2000 | Noguchi | H01L 21/8238 257/314 |
| 6,127,836 A | 10/2000 | Jacobson et al. | |
| 2002/0005731 A1 | 1/2002 | Ootsuji | |

(Continued)

OTHER PUBLICATIONS

McMullen, Timothy. "Tomorrow's Chip Interconnects Call for a New Reliability Test Method." EvaluationEngineering.com Aug. 2015: 20-21. Online.

(Continued)

*Primary Examiner* — Paresh H Patel
(74) *Attorney, Agent, or Firm* — Dascenzo Intellectual Property Law, P.C.

(57) ABSTRACT

Systems and methods for electrically testing electromigration in an electromigration test structure are disclosed herein. The systems include a voltage control portion, a current control portion, and a current regulating structure. The systems further include an electric current detector, a first system connection, and a second system connection. The systems also include a voltage detector, and a controller. In some embodiments of the methods, a voltage control portion regulates a high-side signal electric current to maintain a voltage difference below a voltage setpoint while a current control portion maintains the high-side signal electric current below a threshold current value. In some embodiments of the methods, one of the voltage difference and a magnitude of the high-side signal electric current is selected as a primary control parameter while the other is selected as a compliant control parameter.

20 Claims, 3 Drawing Sheets

(56) References Cited

U.S. PATENT DOCUMENTS

2008/0098270 A1*  4/2008  De Ceuninck ..... G01R 31/2856
                                                      714/738
2009/0031264 A1   1/2009  Rittman et al.
2012/0300606 A1  11/2012  Li et al.

OTHER PUBLICATIONS

Vogler, Debra. "Cascade Microtech Addresses Need for Constant Voltage EM Testing." *Chip Scale Review* May 2015: 1-6. Online.
Tang, B.J. et at. "Constant Voltage Electromigration for Advanced BEOL Copper Interconnects." *2015 IEEE International Reliability Physics Symposium* Apr. 2015: 2D.6.1-2D6.5. Online.
Cascade Microtech, Inc. *Cascade Microtech Introduces Multipurpose Module for IC Failure Capture.* 2015. Online.
Happich, Julien. "Multipurpose Module Captures IC Failure." OFweek.com Apr. 2015: 1-5. Online.

* cited by examiner

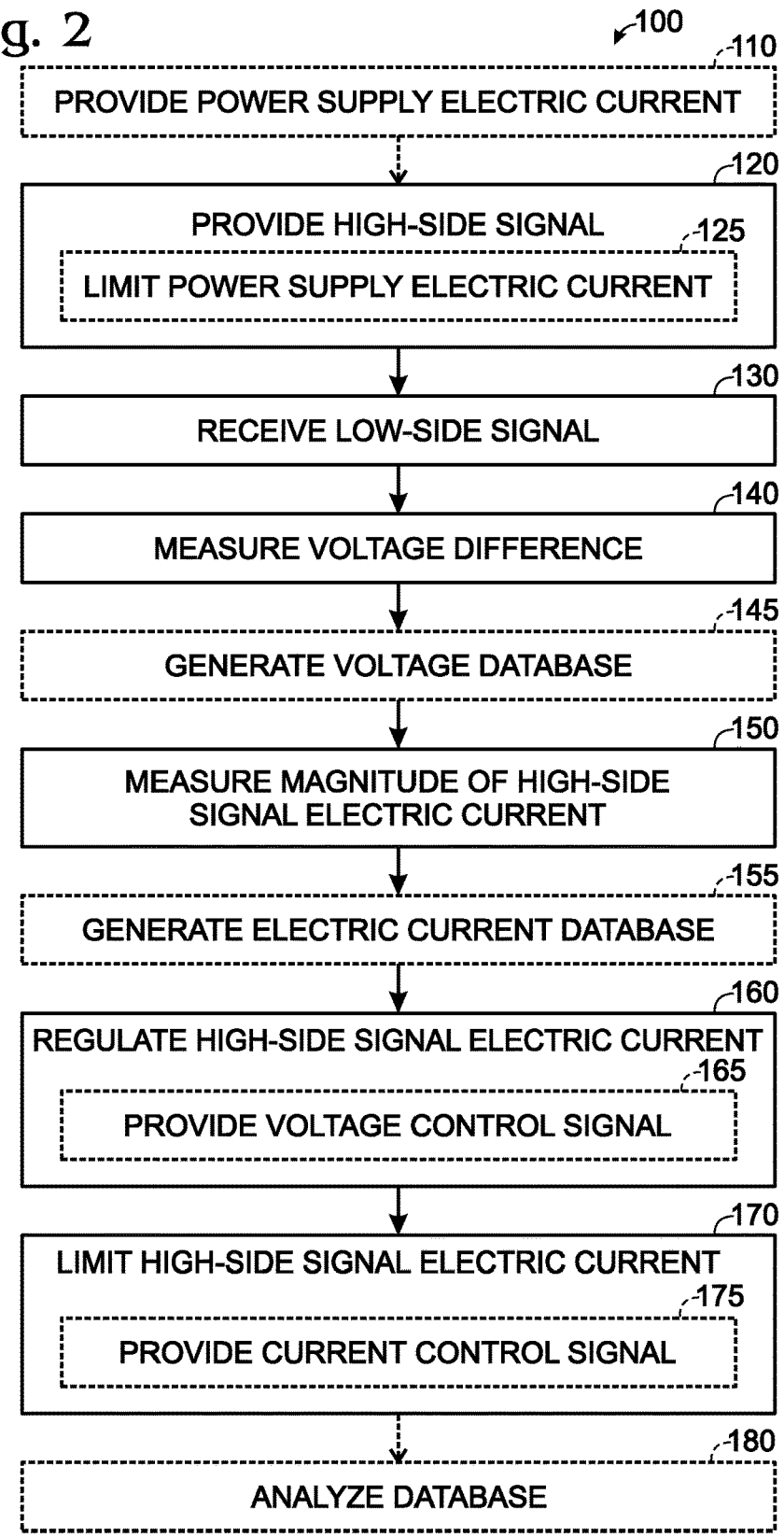

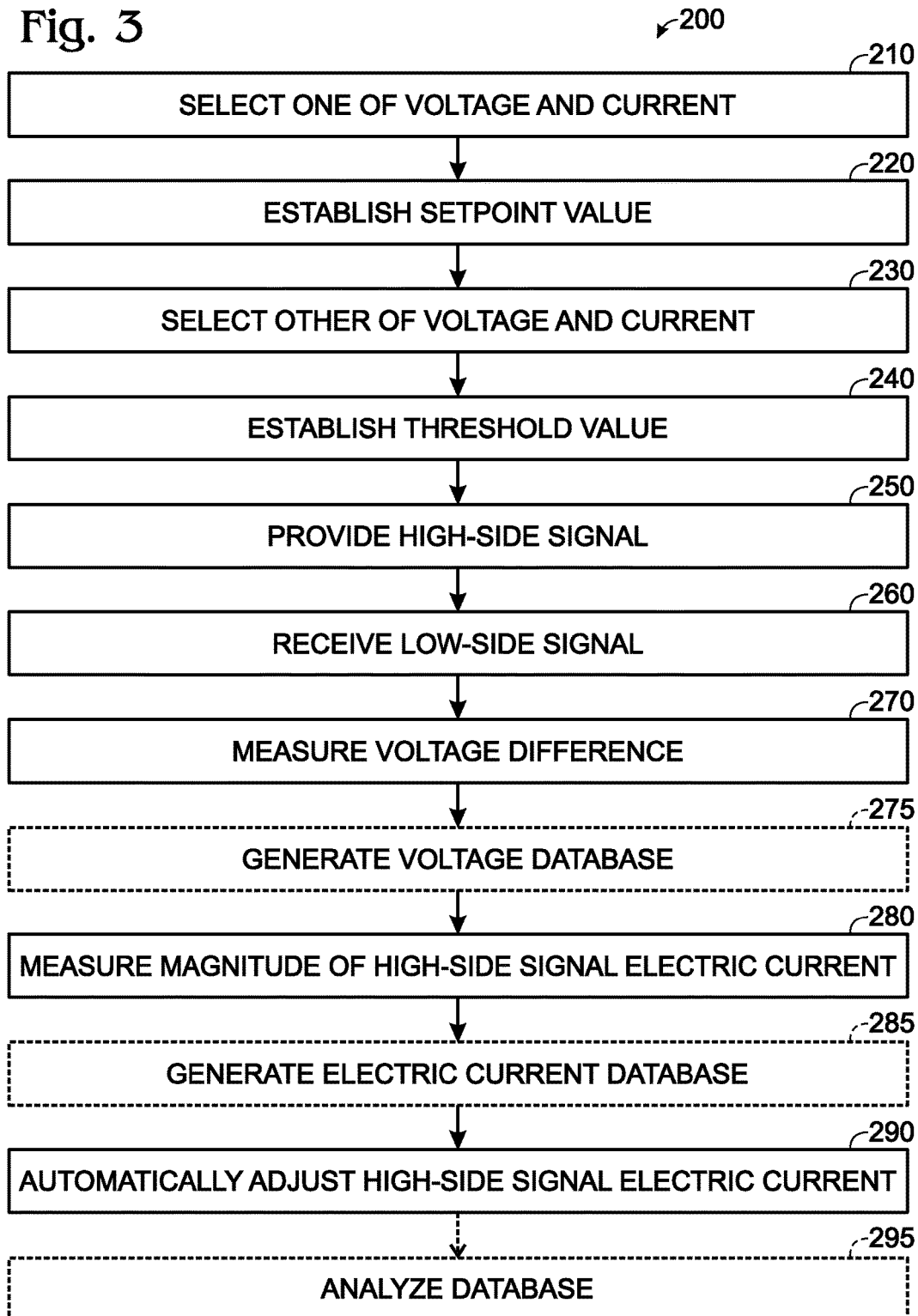

SYSTEMS AND METHODS FOR ELECTRICALLY TESTING ELECTROMIGRATION IN AN ELECTROMIGRATION TEST STRUCTURE

FIELD OF THE DISCLOSURE

The present disclosure relates generally to systems and methods for electrically testing electromigration in an electromigration test structure.

BACKGROUND OF THE DISCLOSURE

Electromigration is the motion, or transport, of the atoms of an electrical conductor with time and is caused by a flow of electric current through the conductor. Many semiconductor devices include a large quantity of very small electrical conductors; and electromigration may, in certain circumstances, produce failure of these very small electrical conductors.

Electromigration tests may be utilized to test for this motion of the atoms of the electrical conductor. Historically, electromigration tests have been constant current tests in which a predetermined electric current is applied to an electromigration test structure. While such tests may be effective in certain circumstances, they may be difficult, or even impossible, to interpret in others. As an example, the presence of a defect, such as a void or a non-conductive particle, within a portion of the electromigration test structure may cause a high electric field to be developed, proximal to the defect, during constant current electromigration tests. This high electric field may, in extreme circumstances, lead to destruction of the electromigration test structure, thereby preventing the collection of meaningful electromigration data.

Historical electromigration test structures have utilized an electrically conductive diffusion barrier between the electromigration test structure and a dielectric material that surrounds the electromigration test structure. The presence of such electrically conductive diffusion barriers mitigates the impact of defects by providing an alternative electric current pathway, thus decreasing a potential for destruction of the electromigration test structure during testing thereof. However, in future technology nodes, it is anticipated that diffusion barriers may be electrically insulating, increasing a potential for destruction of the electromigration test structure during electromigration testing. Thus, there exists a need for improved systems and methods for electrically testing electromigration in an electromigration test structure.

SUMMARY OF THE DISCLOSURE

Systems and methods for electrically testing electromigration in an electromigration test structure are disclosed herein. The systems include a voltage control portion, a current control portion, and a current regulating structure. The voltage control portion is configured to receive a voltage setpoint signal and to generate a voltage control signal that is based upon the voltage setpoint signal. The current control portion is configured to receive a current setpoint signal and to generate a current control signal that is based upon the current setpoint signal. The current regulating structure is configured to receive a power supply electric current, to receive the voltage control signal, to receive the current control signal, and to generate a high-side signal from the power supply electric current. The high-side signal has a high-side signal voltage and a high-side signal electric current and the current regulating structure regulates the high-side signal electric current based upon both the voltage control signal and the current control signal.

The systems further include an electric current detector, a first system connection, and a second system connection. The electric current detector is configured to measure a magnitude of the high-side signal electric current and to generate a detected current signal that is based upon the magnitude of the high-side signal electric current. The first system connection is configured to receive the high-side signal, to electrically contact a first test connection of the electromigration test structure, and to provide the high-side signal to the first test connection. The second test connection is configured to electrically contact a second test connection of the electromigration test structure and to receive a low-side signal from the second test connection.

The systems also include a voltage detector and a controller. The voltage detector is configured to measure a voltage difference between the high-side signal and the low-side signal and to generate a detected voltage signal that is based upon the voltage difference. The controller is configured to receive the detected current signal, to receive the detected voltage signal, to generate the voltage setpoint signal, and to generate the current setpoint signal. The controller is programmed to selectively control the voltage setpoint signal to maintain the voltage difference at a voltage setpoint and to selectively control the current setpoint signal to maintain the high-side signal electric current below a threshold current value.

In some embodiments, the methods include providing a high-side signal to an electromigration test structure at a high-side signal electric current and a high-side signal voltage. These methods also include receiving a low-side signal from the electromigration test structure at a low-side signal voltage, measuring a voltage difference between the high-side signal and the low-side signal, and measuring a magnitude of the high-side signal electric current. These methods further include regulating the high-side signal electric current via a voltage control portion to maintain a voltage difference below a voltage setpoint and limiting the high-side signal electric current via a current control portion to maintain the high-side signal electric current below a threshold current value.

In some embodiments, the methods include selecting one of a magnitude of a high-side signal electric current and a voltage difference between a high-side signal voltage and a low-side signal voltage as a primary control parameter and selecting the other as a compliant control parameter. These methods also include establishing a setpoint value for the primary control parameter and establishing a threshold value for the compliant control parameter. These methods further include providing a high-side signal to an electromigration test structure, receiving a low-side signal from the electromigration test structure, measuring the voltage difference, and measuring the magnitude of the high-side signal electric current. These methods also include automatically adjusting the high-side signal electric current to maintain the primary control parameter at the setpoint value and also to maintain the compliant control parameter below the threshold value.

BRIEF DESCRIPTION OF THE DRAWINGS

FIG. 2 is a flowchart depicting methods, according to the present disclosure, of performing a constant-voltage electromigration test of an electromigration test structure.

FIG. 3 is a flowchart depicting methods, according to the present disclosure, of electrically testing electromigration in an electromigration test structure utilizing either a constant voltage or a constant current electromigration test.

DETAILED DESCRIPTION AND BEST MODE OF THE DISCLOSURE

Figure 1:
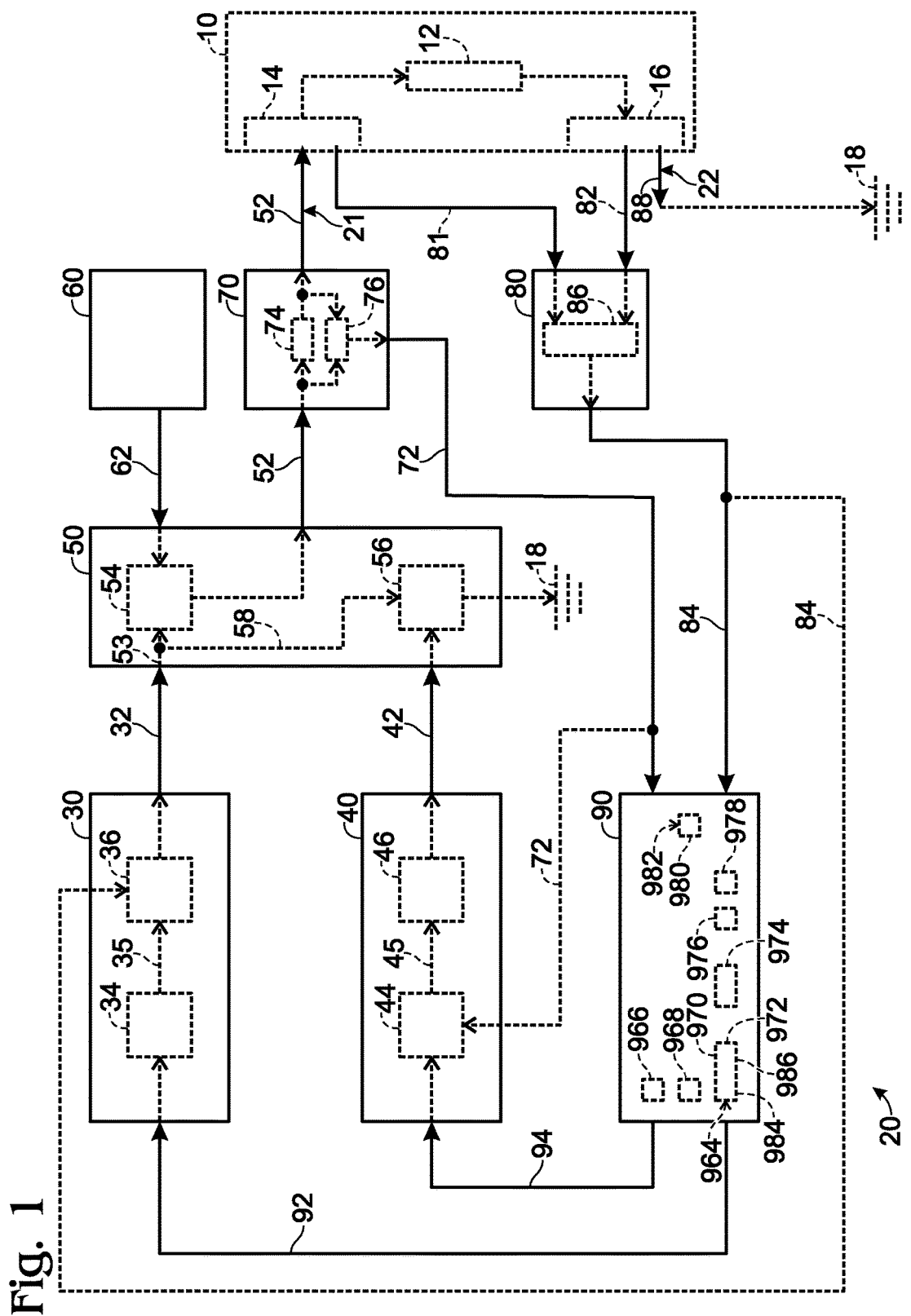
FIG. 1 is a schematic representation of examples of a test system for electrically testing electromigration according to the present disclosure.

FIGS. 1-3 provide examples of test systems 20, of methods 100, and/or of methods 200, according to the present disclosure, for electrically testing electromigration in an electromigration test structure. Elements, components, and/or features that are discussed herein with reference to one or more of FIGS. 1-3 may be included in and/or utilized with any of FIGS. 1-3 without departing from the scope of the present disclosure. In general, elements that are likely to be included in a particular embodiment are illustrated in solid lines, while elements that are optional are illustrated in dashed lines. However, elements that are shown in solid lines may not be essential and, in some embodiments, may be omitted without departing from the scope of the present disclosure.

FIG. 1 is a schematic representation of examples of a test system 20 according to the present disclosure. Test system 20 may be configured to electrically test electromigration in an electromigration test structure 12, which may form a portion of, or may be, a device under test (DUT) 10. Test system 20 also may be referred to herein as a system 20 and includes a voltage control portion 30, which is adapted, configured, designed, and/or constructed to receive a voltage setpoint signal 92 and to generate a voltage control signal 32 based, at least in part, on the voltage setpoint signal. System 20 also includes a current control portion 40, which is adapted, configured, designed, and/or constructed to receive a current setpoint signal 94 and to generate a current control signal 42 that is based, at least in part, on the current setpoint signal.

System 20 further includes a current regulating structure 50. Current regulating structure 50 is adapted, configured, designed, and/or constructed to receive a power supply electric current 62 from a power supply 60, to receive voltage control signal 32, and also to receive current control signal 42. Current regulating structure 50 also is adapted, configured, designed, and/or constructed to generate a high-side signal 52 from power supply electric current 62. High-side signal 52 also may be referred to herein as a test signal 52 and has a high-side signal electric current and a high-side signal voltage. Current regulating structure 50 regulates the high-side signal electric current based, at least in part, on both the voltage control signal and the current control signal. Stated another way, current regulating structure 50 may restrict the flow of power supply electric current 62 therethrough to produce and/or generate high-side signal 52, and this restriction may be based, at least in part, on the voltage control signal and on the current control signal.

System 20 also includes an electric current detector 70. Electric current detector 70 is adapted, configured, designed, and/or constructed to detect, measure, and/or quantify a magnitude of the high-side signal electric current and to generate a detected current signal 72 that is based upon, or indicative of, the magnitude of the high-side signal electric current.

System 20 further includes a first system connection 21 and a second system connection 22. First system connection 21 is adapted, configured, designed, and/or constructed to receive high-side signal 52, to electrically contact a first test connection 14 of electromigration test structure 12, and to provide the high-side signal to the first test connection. Second system connection 22 is adapted, configured, designed, and/or constructed to electrically contact a second test connection 16 of electromigration test structure 12 and to receive a low-side signal 88 from the second test connection. Low-side signal 88 also may be referred to herein as a resultant signal 88.

System 20 also includes a voltage detector 80. Voltage detector 80 is configured to measure a voltage difference between high-side signal 52 and low-side signal 88 and to generate a detected voltage signal 84 that is based upon, or indicative of, the voltage difference.

System 20 further includes a controller 90. Controller 90 is adapted, configured, designed, and/or constructed to receive detected voltage signal 84 and detected current signal 72. Controller 90 further is adapted, configured, designed, constructed, and/or programmed to generate voltage setpoint signal 92 and current setpoint signal 94 based, at least in part, on the detected voltage signal and on the detected current signal. As an example, controller 90 may selectively control the voltage setpoint signal to maintain the voltage difference at a voltage setpoint. As another example, controller 90 may selectively control the current setpoint signal to maintain the high-side signal electric current below a threshold current value.

During operation of system 20, first test connection 14 of DUT 10 may be brought into electrical communication with first system connection 21. Similarly, second test connection 16 of DUT 10 may be brought into electrical communication with second system connection 22. Subsequently, electromigration test structure 12 of DUT 10 may be tested by system 20. This may include testing electromigration test structure 12 to measure, quantify, and/or estimate electromigration therein and/or to measure, quantify, and/or estimate electromigration within one or more other structures of DUT 10. Additionally or alternatively, this may include testing electromigration structure 12 to establish whether or not electrical traces of DUT 10 exhibit less than a threshold, or maximum allowable, electromigration during operation thereof.

The testing of DUT 10 may be performed in any suitable manner, such as is described herein with reference to methods 100 of FIG. 2 and/or with reference to methods 200 of FIG. 3. As an example, the testing of DUT 10 may include providing high-side signal 52 to the DUT and receiving low-side signal 88 from the DUT. Concurrently, the magnitude of the high-side signal electric current may be measured with electric current detector 70, and detected current signal 72 may be provided to controller 90 by electric current detector 70. Similarly, the voltage difference between the high-side signal and the low-side signal may be measured with voltage detector 80, and detected voltage signal 84 may be provided to controller 90 by voltage detector 80.

Controller 90 may receive detected current signal 72 and may selectively control, regulate, and/or generate current setpoint signal 94 based, at least in part, on the detected current signal. This may include controlling the current setpoint signal to maintain the high-side signal electric current below the threshold value. Controller 90 also may receive detected voltage signal 84 and may selectively control, regulate, and/or generate voltage setpoint signal 92 based, at least in part, on the detected voltage signal. This may include controlling the voltage setpoint signal to maintain the voltage difference at the voltage setpoint and/or to maintain the voltage difference within a threshold voltage tolerance of the voltage setpoint.

Voltage setpoint signal 92 may be received by voltage control portion 30, and the voltage control portion may generate voltage control signal 32 based, at least in part, on the voltage setpoint signal. Similarly, current setpoint signal 94 may be received by current control portion 40, and the current control portion may generate current control signal 42 based, at least in part, on the current setpoint signal. Voltage control signal 32 and current setpoint signal 42 may be provided to current regulating structure 50, which may generate high-side signal 52 based thereon. This process may be repeated any suitable number of times during testing of DUT 10.

Voltage control portion 30 may include any suitable structure that may receive voltage setpoint signal 92 and/or that may generate voltage control signal 32 based, at least in part, on the voltage setpoint signal. As an example, and as illustrated in dashed-dot-dot lines in FIG. 1, voltage control portion 30 may include a voltage gain amplifier 34 and a voltage offset adjustment amplifier 36. Voltage gain amplifier 34 may be configured to receive voltage setpoint signal 92 and to generate an amplified voltage setpoint signal 35 that is based upon the voltage setpoint signal. Voltage offset adjustment amplifier 36 may be configured to receive voltage setpoint signal 92 and also to receive detected voltage signal 84.

Voltage offset adjustment amplifier 36 further may be configured to compare the amplified voltage setpoint signal to the detected voltage signal and to generate the voltage control signal based upon the comparison of the amplified voltage setpoint signal to the detected voltage signal. As an example, voltage offset adjustment amplifier 36 may modify voltage control signal 32 to increase the magnitude of the high-side signal electric current responsive to the detected voltage signal being less than the amplified voltage setpoint signal. As another example, voltage offset adjustment amplifier 36 may modify voltage control signal 32 to decrease the magnitude of the high-side signal electric current responsive to the detected voltage signal being greater than the amplified voltage setpoint signal. In this manner, voltage offset adjustment amplifier 36 adjusts and/or accounts for differences between the actual voltage difference between high-side signal 52 and low-side signal 88, as measured by voltage detector 80, and the desired voltage difference, as indicated by voltage setpoint signal 92.

Current control portion 40 may include any suitable structure that may receive current setpoint signal 94 and/or that may generate current control signal 42 based, at least in part, on the current setpoint signal. As an example, and as illustrated in dashed lines in FIG. 1, current control portion 40 may include a current offset adjustment amplifier 44 and an integrator amplifier 46.

Current offset adjustment amplifier 44 may be configured to receive current setpoint signal 94 and detected current signal 72, to compare the current setpoint signal to the detected current signal, and to generate a current offset signal 45 that is based, at least in part, on the comparison of the current setpoint signal to the detected current signal. As an example, current offset adjustment amplifier 44 may be configured to modify current offset signal 45 to increase the magnitude of the high-side signal electric current responsive to detected current signal 72 being less than current setpoint signal 94. As another example, current offset adjustment amplifier 44 may be configured to modify current offset signal 45 to decrease the magnitude of the high-side signal electric current responsive to detected current signal 72 being greater than current setpoint signal 94. In this manner, current offset adjustment amplifier 44 adjusts and/or accounts for differences between the actual high-side signal electric current, as measured by current detector 70, and the desired high-side signal electric current, as indicated by current setpoint signal 94.

Integrator amplifier 46 may receive current offset signal 45 from current offset adjustment amplifier 44. In addition, integrator amplifier 46 may integrate the current offset signal and generate current control signal 42 based, at least in part, on the integrated current offset signal.

Current regulating structure 50 may include any suitable structure that may receive power supply electric current 62, that may receive voltage control signal 32, that may receive current control signal 42, and/or that may generate high-side signal 52 from power supply electric current 62 based, at least in part, on the voltage control signal and on the current control signal. As an example, and as illustrated in dashed lines in FIG. 1, current regulating structure 50 may include a voltage control signal conductor 53, a current drive transistor 54, a base current stealing transistor 56, and a base current stealing conductor 58. Current drive transistor 54 may be configured to receive at least a fraction of voltage control signal 32 and also to receive power supply electric current 62. In addition, current drive transistor 54 may be configured to generate high-side signal 52 from power supply electric current 62 based, at least in part, on voltage control signal 32. As an example, current drive transistor 54 may be configured to increase the magnitude of high-side signal 52 responsive to an increase in voltage control signal 32 and/or responsive to an increase in the fraction of voltage control signal 32 that is provided to the current drive transistor. As another example, current drive transistor 54 may be configured to decrease the magnitude of high-side signal 52 responsive to a decrease in voltage control signal 32 and/or responsive to a decrease in the fraction of voltage control signal 32 that is provided to the current drive transistor.

Base current stealing transistor 56 may be configured to receive current control signal 42 and to regulate the fraction of voltage control signal 32 that is provided to current drive transistor 54 based, at least in part, on the current control signal. As an example, voltage control signal conductor 53 may convey the fraction of voltage control signal 32 to current drive transistor 54, and base current stealing conductor 58 may extend between voltage control signal conductor 53 and base current stealing transistor 56. Under these conditions, base current stealing transistor 56 may be configured to selectively vary a resistance between base current stealing conductor 58 and ground 18, thereby regulating and/or decreasing the fraction of voltage control signal 32 that is provided to current drive transistor 54.

Power supply 60 may include, or be, any suitable structure that may provide power supply electric current 62 to current regulating structure 50. As examples, power supply 60 may include a direct current (DC) power supply, an alternating current (AC) power supply, a low frequency power supply, and/or a high frequency power supply. It is within the scope of the present disclosure that system 20 may include power supply 60; however, it is also within the scope of the present disclosure that system 20 may not include, but may be in electrical communication with, power supply 60.

Electric current detector 70 may include any suitable structure that may be adapted, configured, designed, and/or constructed to measure and/or detect the magnitude of high-side signal 52 and to generate detected current signal 72. As an example, and as illustrated in dashed lines in FIG. 1, electric current detector 70 may include a sense resistor 74 and/or a current measurement amplifier 76. Sense resistor 74 may be configured to convey the high-side signal electric current, and current measurement amplifier 76 may be configured to measure and/or detect a voltage drop across sense resistor 74 and to generate the detected current signal based, at least in part, on the voltage drop across the sense resistor. Detected current signal 72 may include, or be, any suitable signal. As an example, the detected current signal may include, have, or exhibit a signal voltage that is proportional to, or indicative of, the magnitude of the high-side signal electric current.

Voltage detector 80 may include any suitable structure that may be adapted, configured, designed, and/or constructed to measure the voltage difference between high-side signal 52 and low-side signal 88 and/or to generate detected voltage signal 84 based upon the voltage difference. As an example, and as illustrated in dashed lines in FIG. 1, voltage detector 80 may include a first voltage connection 81, a second voltage connection 82, and/or a voltage measurement amplifier 86.

First voltage connection 81 may be in electrical communication with first test connection 14 of DUT 10, and second voltage connection 82 may be in electrical communication with second test connection 16 of DUT 10. Under these conditions, voltage detector 80 may be configured to measure a voltage difference between the first voltage connection and the second voltage connection. As such, test system 20 and/or voltage detector 80 thereof may be configured for a four-point, Kelvin, or quasi-Kelvin measurement of the voltage difference between high-side signal 52 and low-side signal 88. Voltage measurement amplifier 86 may be configured to measure and/or quantify the voltage difference between high-side signal 52 and low-side signal 88 and to generate detected voltage signal 84 based upon the voltage difference.

Controller 90 may include and/or utilize any suitable structure that may be adapted, configured, designed, constructed, and/or programmed to receive detected current signal 72 and detected voltage signal 84 and to generate voltage setpoint signal 92 and current setpoint signal 94. This may include any suitable computer, special purpose computer, general purpose computer, personal computer, general-purpose controller, programmable controller, and/or special-purpose controller. In addition, controller 90 may control the operation of system 20 in any suitable manner. As an example, controller 90 may be configured to control system 20 according to any suitable portion of methods 100 of FIG. 2 and/or any suitable portion of methods 200 of FIG. 3.

As another example, and upon initiating testing of DUT 10, controller 90 may be programmed to increase current setpoint signal 94 to a current setpoint value, prior to initiating generation of high-side signal 52, prior to initiating supply of the high-side signal to first system connection 21, and/or prior to initiating supply of the high-side signal to first test connection 14. In systems 20 that include current drive transistor 54 and base current stealing transistor 56, this may be accomplished by increasing current setpoint signal 94 prior to increasing voltage setpoint signal 92.

In addition, controller 90 also may be programmed to incrementally increase current setpoint signal 94 from an initial current setpoint signal value to the current setpoint value. Such a configuration may permit integrator amplifier 46 of current control portion 40 to stabilize prior to high-side signal 52 being provided to DUT 10, thereby preventing the supply of voltage and/or current spikes to DUT 10.

Subsequent to current setpoint signal 94 being increased to the current setpoint value, controller 90 then may initiate supply of high-side signal 52 to first test connection 14 and/or to first system connection 21. This may be accomplished by increasing voltage setpoint signal 92 to a voltage setpoint value. The increase in the voltage setpoint signal may include incrementally increasing the voltage setpoint signal from an initial voltage setpoint signal value to the voltage setpoint value.

System 20 may be configured to test electromigration in any suitable DUT 10. As examples, system 20 may be configured to test electromigration in an unpackaged DUT 10, such as a DUT 10 that is located on a semiconductor wafer that includes a plurality of DUTs 10 and/or a singulated die that includes DUT 10. As another example, system 20 may be configured to test electromigration in a packaged DUT 10.

With this in mind, first test connection 14, second test connection 16, first system connection 21, second system connection 22, first voltage connection 81, and/or second voltage connection 82 may include, or be, any suitable structure that is configured to form a corresponding electrical connection. As examples, first system connection 21 may include, or be, a first system probe, a first system needle probe, a first system rocking beam probe, a first system pin, and/or a first system socket. Similarly, second system connection 22 may include, or be, a second system probe, a second system needle probe, a second system rocking beam probe, a second system pin, and/or a second system socket. First system connection 21 and/or second system connection 22 may form a portion of and/or be defined by a probe card. In addition, and as illustrated in FIG. 1, second system connection 22 may include, or be, a grounded system connection that is connected to ground 18.

As additional examples, first voltage connection 81 may include, or be, a first voltage probe, a first voltage needle probe, a first voltage rocking beam probe, a first voltage pin, and/or a first voltage socket. Similarly, second voltage connection 82 may include, or be, a second voltage probe, a second voltage needle probe, a second voltage rocking beam probe, a second voltage pin, and/or a second voltage socket. First voltage connection 81 and/or second voltage connection 82 may form a portion of and/or be defined by the probe card.

As further examples, first test connection 14 may include, or be, a first contact pad, a first test pad, a first solder ball, a first test pin and/or a first test socket. Similarly, second test connection 16 may include, or be, a second contact pad, a second test pad, a second solder ball, a second test pin, and/or a second test socket.

FIG. 2 is a flowchart depicting methods 100, according to the present disclosure, of electrically testing electromigration in an electromigration test structure. Methods 100 may be referred to herein as methods of utilizing and/or performing a constant voltage electromigration test of the electromigration test structure utilizing the test system. Methods 100 may be performed with and/or utilizing a test system that includes a voltage control portion and a current control portion, such as test system 20 of FIG. 1. Methods 100 may include providing a power supply electric current at 110, and methods 100 include providing a high-side signal at 120, receiving a low-side signal at 130, measuring a voltage difference at 140, measuring a magnitude of a high-side signal electric current at 150, regulating the high-side signal electric current at 160, and limiting the high-side signal electric current at 170. Methods 100 further may include generating a voltage database at 145, generating an electric current database at 155, and/or analyzing a database at 180.

Providing the power supply electric current at 110 may include providing any suitable power supply electric current in any suitable manner. As an example, the providing at 110 may include providing the power supply electric current via and/or utilizing a power supply, such as power supply 60 of FIG. 1. As an additional example, the providing at 110 may include providing the power supply electric current to a current regulating structure, such as current regulating structure 50 of FIG. 1. Under these conditions, the regulating at 160 may include providing a voltage control signal at 165 from the voltage control portion and to the current regulating structure. In addition, the limiting at 170 may include providing a current control signal at 175 from the current control portion and to the current regulating structure.

Providing the high-side signal at 120 may include providing the high-side signal to the electromigration structure. Additionally or alternatively, the providing at 120 may include providing the high-side signal at a high-side signal electric current and a high-side signal voltage.

The providing at 120 may be accomplished in any suitable manner. As an example, the providing at 120 may include providing via and/or utilizing a first system connection, such as first system connection 21 of FIG. 1. As an example, and when methods 100 include the providing at 110, the providing at 120 may include limiting the power supply electric current, with the current regulating device, to produce and/or generate the high-side signal, as indicated in FIG. 2 at 125. This may include limiting the power supply electric current based, at least in part, on the voltage control signal and/or on the current control signal.

The limiting at 125 may include increasing the high-side signal electric current responsive to the voltage difference, which is measured during the measuring at 140, being less than a threshold voltage difference. The limiting at 125 additionally or alternatively may include decreasing the high-side signal electric current responsive to the voltage difference being greater than the threshold voltage difference. The limiting at 125 also may include decreasing the high-side signal electric current responsive to the magnitude of the high-side signal electric current, as measured during the measuring at 150, being greater than a threshold current value.

Receiving the low-side signal at 130 may include receiving any suitable low-side signal in any suitable manner. As an example, and responsive to receipt of the high-side signal, the electromigration test structure may produce and/or generate the low-side signal. As another example, the low-side signal may have and/or define a low-side signal voltage, and the low-side signal voltage may be different from, or less than, the high-side signal voltage. As yet another example, the receiving at 130 may include receiving via and/or utilizing a second system connection, such as second system connection 22 of FIG. 1.

Measuring the voltage difference at 140 may include measuring a voltage difference between the high-side signal voltage and the low-side signal voltage and may be accomplished in any suitable manner. As an example, the measuring at 140 may include measuring via and/or utilizing a voltage detector, such as voltage detector 80 of FIG. 1. This may include establishing electrical contact between a first test connection of a device under test (DUT), such as first test connection 14 of FIG. 1, and a first voltage connection of the voltage detector, such as first voltage connection 81 of FIG. 1. This also may include establishing electrical contact between a second test connection of the DUT, such as second test connection 16 of FIG. 1, and a second voltage connection of the voltage detector, such as second voltage connection 82 of FIG. 1.

Methods 100 and/or the measuring at 140 further may include generating a voltage database, as indicated at 145. The voltage database may include, or be, a database of the voltage difference, as determined during the measuring at 140, as a function of time. The generating at 145 may include generating during the providing at 120, generating during the receiving at 130, generating during the measuring at 140, and/or generating responsive to the measuring at 140.

Measuring the magnitude of the high-side signal electric current at 150 may include measuring in any suitable manner and/or utilizing any suitable structure. As an example, the measuring at 150 may include measuring with an electric current detector, such as electric current detector 70 of FIG. 1.

Methods 100 and/or the measuring at 150 further may include generating an electric current database, as indicated at 155. The electric current database may include, or be, a database of the magnitude of the high-side signal electric current, as determined during the measuring at 150, as a function of time. The generating at 155 may include generating during the providing at 120, generating during the receiving at 130, generating during the measuring at 150, and/or generating responsive to the measuring at 150.

Regulating the high-side signal electric current at 160 may include regulating via the voltage control portion. Additionally or alternatively, the regulating at 160 may include regulating to maintain the voltage difference at a voltage setpoint. As discussed herein with reference to the limiting at 125, the regulating at 160 may include providing the voltage control signal from the voltage control portion to the current regulating structure. As an example, the regulating at 160 may include increasing the high-side signal electric current responsive to the voltage difference being less than the voltage setpoint. As another example, the regulating at 160 may include decreasing the high-side signal electric current responsive to the voltage difference being greater than the voltage setpoint.

Limiting the high-side signal electric current at 170 may include limiting via the current control portion. Additionally or alternatively, the limiting at 170 may include limiting to maintain the high-side signal electric current below a threshold current value. As discussed herein with reference to the limiting at 125, the regulating at 160 may include providing the current control signal from the current control portion to the current regulating structure. An example of the limiting at 170 may include decreasing the high-side signal electric current responsive to the high-side signal electric current being greater than the threshold current value.

Analyzing the database at 180 may include analyzing any suitable database, such as the voltage database that was generated during the generating at 145 and/or the electric current database that was generated during the generating at 155. The analyzing at 180 may include analyzing to detect, determine, and/or quantify electromigration within the electromigration test structure of the device under test and may be performed in any suitable manner. As an example, the analyzing at 180 may include analyzing both the voltage database and the electric current database to determine a resistance of the electromigration test structure as a function of time.

It is within the scope of the present disclosure that the various steps of methods 100 may be formed with any suitable timing and/or sequence. As an example, the providing at 120, the receiving at 130, the measuring at 140, and the measuring at 150 may be performed concurrently, at least substantially concurrently, or at least partially concurrently during methods 100. Stated another way, methods 100 may be performed such that there is an at least partial temporal overlap among the providing at 120, the receiving at 130, the measuring at 140, and the measuring at 150. As another example, the providing at 120 and the receiving at 130 may be performed continuously, or at least substantially continuously, during methods 100. As yet another example, the providing at 120 and the receiving at 130 may be performed continuously, or at least substantially continuously, during the measuring at 140, during the measuring at 150, during the regulating at 160, and/or during the limiting at 170. As another example, the regulating at 160 may include adjusting a magnitude of the high-side signal electric current that is provided to the electromigration test structure during the providing at 120. As another example, the limiting at 170 may include limiting the magnitude of the high-side signal electric current that is provided to the electromigration test structure during the providing at 120.

FIG. 3 is a flowchart depicting methods 200, according to the present disclosure, of electrically testing electromigration in an electromigration test structure. Methods 200 may be referred to herein as utilizing and/or performing either a constant voltage or a constant current electromigration test. Methods 200 may be performed with, via, and/or utilizing a test system, such as test system 20 of FIG. 1. The test system may be configured to provide a high-side signal to a device under test (DUT) at a high-side signal electric current and a high-side signal voltage. The test system also may be configured to receive a low-side signal from the DUT at a low-side signal voltage. The test system may include a voltage control portion and a current control portion. The voltage control portion and the current control portion collectively may regulate the high-side signal electric current by controlling the operation of a current regulating structure.

Methods 200 include selecting one of a magnitude of the high-side signal electric current and a voltage difference between the high-side signal voltage and the low-side signal voltage as a primary control parameter at 210, and establishing a setpoint value for the primary control parameter at 220. Methods 200 also include selecting the other parameter of the high-side signal electric current and the voltage difference between the high-side signal voltage and the low-side signal voltage as a compliant control parameter at 230, and establishing a threshold value for the compliant control parameter at 240. Methods 200 further include providing the high-side signal at 250, receiving the low-side signal at 260, measuring a voltage difference at 270, measuring a magnitude of a high-side signal electric current at 280, and automatically adjusting the high-side signal electric current at 290.

Selecting one of the magnitude of the high-side signal electric current and the voltage difference between the high-side signal voltage and the low-side signal voltage as a primary control parameter at 210 may include performing the selecting for a given electrical test of a given electromigration test structure. Stated another way, the selecting at 210 may include selecting, for the given electromigration test, which of the high-side signal electric current and the voltage difference is the primary control parameter. When the magnitude of the high-side signal electric current is selected as the primary control parameter, methods 200 may test the given electromigration test structure under constant current conditions. Conversely, and when the voltage difference is selected as the primary control parameter, methods 200 may test the given electromigration test structure under constant voltage conditions.

Establishing the setpoint value for the primary control parameter at 220 may include establishing any suitable setpoint, target, or desired value for the primary control parameter. When the magnitude of the high-side signal electric current is selected as the primary control parameter, the establishing at 220 may include establishing a set point value for the magnitude of the high-side signal electric current. When the voltage difference is selected as the primary control parameter, the establishing at 220 may include establishing a set point value for the voltage difference.

Selecting the other parameter of the high-side signal electric current and the voltage difference between the high-side signal voltage and the low-side signal voltage as the compliant control parameter at 230 may include performing the selecting for the given electrical test of the given electromigration structure. Stated another way, the selecting at 230 may include selecting, for the given electromigration test, which of the high-side signal electric current and the voltage difference is the compliant control parameter. When the magnitude of the high-side signal electric current is selected as the compliant control parameter, methods 200 may test the given electromigration test structure under constant voltage conditions. Conversely, and when the voltage difference is selected as the compliant control parameter, methods 200 may test the given electromigration test structure under constant current conditions.

Establishing the threshold value for the compliant control parameter at 240 may include establishing any suitable threshold, or maximum, value for the compliant control parameter. When the magnitude of the high-side signal electric current is selected as the compliant control parameter, the establishing at 240 may include establishing a threshold value for the magnitude of the high-side signal electric current. When the voltage difference is selected as the compliant control parameter, the establishing at 240 may include establishing a threshold value for the voltage difference.

Providing the high-side signal at 250 may include providing the high-side signal to the device under test and/or to the electromigration test structure of the device under test. The providing at 250 may be similar, or at least substantially similar, to the providing at 120, which is discussed herein with reference to methods 100 of FIG. 2.

Receiving the low-side signal at 260 may include receiving the low-side signal from the device under test and/or from the electromigration test structure of the device under test. The receiving at 260 may be similar, or at least substantially similar, to the receiving at 130, which is discussed herein with reference to methods 100 of FIG. 2.

Measuring the voltage difference at 270 may include measuring the voltage difference between the high-side signal and the low-side signal. The measuring at 270 may be similar, or at least substantially similar, to the measuring at 140, which is discussed herein with reference to methods 100 of FIG. 2. Measuring the magnitude of the high-side signal electric current at 280 may be similar, or at least substantially similar, to the measuring at 150, which is discussed herein with reference to methods 100 of FIG. 2.

Similar to methods 100 of FIG. 2, methods 200, or the measuring at 270, further may include generating a voltage database, as indicated at 275. The voltage database may include, or be, a database of the voltage difference, as determined during the measuring at 270, as a function of time. The generating at 275 may include generating during the providing at 250, generating during the receiving at 260, generating during the measuring at 270, and/or generating responsive to the measuring at 270.

Also similar to methods 100 of FIG. 2, methods 200, and/or the measuring at 280, further may include generating an electric current database, as indicated at 285. The electric current database may include, or be, a database of the magnitude of the high-side signal electric current, as determined during the measuring at 280, as a function of time. The generating at 285 may include generating during the providing at 250, generating during the receiving at 260, generating during the measuring at 280, and/or generating responsive to the measuring at 280.

Automatically adjusting the high-side signal electric current at 290 may include automatically adjusting to maintain the primary control parameter at the setpoint value and also to maintain the compliant control parameter below the threshold value. The automatically adjusting at 290 may be accomplished in any suitable manner. As an example, the automatically adjusting at 290 may include increasing the high-side signal electric current, via the current regulating structure, responsive to the primary control parameter being less than the setpoint value. As another example, the automatically adjusting at 290 may include decreasing the high-side signal electric current, via the current regulating structure, responsive to the primary control parameter being greater than the setpoint value. As yet another example, the automatically adjusting at 290 may include decreasing the high-side signal electric current, via the current regulating structure, responsive to the compliant control parameter being greater than the threshold value.

Analyzing the database at 295 may include analyzing any suitable database, such as the voltage database that was generated during the generating at 275 and/or the electric current database that was generated during the generating at 285. The analyzing at 295 may be at least substantially similar to the analyzing at 180, which is discussed herein with reference to methods 100 of FIG. 1.

As discussed, the systems and methods disclosed herein may be utilized to perform constant voltage testing of the given electromigration structure. Thus, the selecting at 210 may include selecting the voltage difference as the primary control parameter, and the selecting at 230 may include selecting the magnitude of the high-side signal electric current as the compliant control parameter. Under these conditions, the automatically adjusting at 290 may include adjusting the high-side signal electric current, via the voltage control portion, to maintain the voltage difference at the setpoint value. In addition, the automatically adjusting at 290 also may include limiting the high-side signal electric current, via the current control portion, to maintain the magnitude of the high-side signal electric current below the threshold value.

As also discussed, the systems and methods disclosed herein may be utilized to perform constant current testing of the given electromigration structure. Thus, the selecting at 210 may include selecting the magnitude of the high-side signal electric current as the primary control parameter, and the selecting at 230 may include selecting the voltage difference as the compliant control parameter. Under these conditions, the automatically adjusting at 290 may include adjusting the high-side signal electric current, via the current control portion, to maintain the magnitude of the high-side signal electric current at the setpoint value. In addition, the automatically adjusting at 290 also may include limiting the high-side signal electric current, via the voltage control portion, to maintain the magnitude of the voltage difference below the threshold value.

Returning to FIG. 1, controller 90 may include any suitable structure. As an example, controller 90 may include a communications framework 966. Communications framework 966 may provide communications between a processor unit 968, a memory 970, persistent storage 972, a communications unit 974, an input/output (I/O) unit 976, and/or a display 978. Memory 970, persistent storage 972, communications unit 974, input/output (I/O) unit 976, and display 978 are examples of resources accessible by processor unit 968 via communications framework 966.

Processor unit 968 serves to run, or execute, instructions that may be loaded into memory 970. Processor unit 968 may include a number of processors, a multi-processor core, or some other type of processor, depending on the particular implementation. Further, processor unit 968 may be implemented using a number of heterogeneous processor systems in which a main processor is present with secondary processors on a single chip. As another illustrative example, processor unit 968 may be a symmetric multi-processor system containing multiple processors of the same type.

Memory 970 and persistent storage 972 are examples of data storage devices 964. A data storage device is any piece of hardware that is capable of storing information, such as, for example, without limitation, data, program code in functional form, and other suitable information either on a temporary basis or a permanent basis.

Data storage devices 964 also may be referred to herein as computer readable storage devices and/or as computer readable storage media 984 and/or as non-transitory computer readable storage media 984 in these examples. Memory 970, in these examples, may be, for example, a random access memory or any other suitable volatile or non-volatile storage device. Persistent storage 972 may take various forms, depending on the particular implementation.

For example, persistent storage 972 may contain one or more components or devices. For example, persistent storage 972 may be a hard drive, a flash memory, a rewritable optical disk, a rewritable magnetic tape, or some combination of the above. The one or more components or devices used by persistent storage 972 also may be removable. For example, a removable hard drive may be used for persistent storage 972.

Communications unit 974, in these examples, provides for communications with other data processing systems or devices. In these examples, communications unit 974 may be a network interface card. Communications unit 974 may provide communications through the use of either or both physical and wireless communications links.

Input/output (I/O) unit 976 allows for input and output of data with other devices that may be connected to controller 90. For example, input/output (I/O) unit 976 may provide a connection for user input through a keyboard, a mouse, and/or some other suitable input device. Further, input/output (I/O) unit 976 may send output to a printer and/or to display 978. Display 978 provides a mechanism to display information to a user.

Instructions for the operating system, applications, and/or programs may be located in data storage devices 964, which may be in communication with processor unit 968 through communications framework 966. The instructions may be in a functional form on persistent storage 972. These instructions may be loaded into memory 970 for execution by processor unit 968. The processes of the different embodiments may be performed by processor unit 968 using computer-implemented instructions, which may be located in a memory, such as memory 970.

These instructions are referred to as program instructions, a program code 980, computer usable program code, or computer readable program code that may be read and/or executed by a processor in processor unit 968. The program code in the different embodiments may be located, stored, and/or embodied on different physical or computer readable storage media, such as memory 970 or persistent storage 972.

Program code 980 may be located in a functional form on computer readable media 982 that may be selectively removable and may be loaded onto or transferred to controller 90 for execution by processor unit 968. Program code 980 and computer readable media 982 may form a computer program product in these examples. In one example, computer readable media 982 may be computer readable storage media 984 or computer readable signal media 986.

Computer readable storage media 984 may include, for example, an optical or magnetic disk that is inserted or placed into a drive or other device that is part of persistent storage 972 for transfer onto a storage device, such as a hard drive, that is part of persistent storage 972. Computer readable storage media 984 also may take the form of a persistent storage, such as a hard drive, a thumb drive, or a flash memory, that is connected to controller 90. In some instances, computer readable storage media 984 may not be removable from controller 90.

Computer readable storage media 984 is a physical or tangible storage device used to store program code 980 rather than a medium that propagates or transmits program code 980. Computer readable storage media 984 is also referred to as a computer readable tangible storage device or a computer readable physical storage device. In other words, computer readable storage media 984 is a media that can be touched by a person.

Alternatively, program code 980 may be transferred to controller 90 using computer readable signal media 986. Computer readable signal media 986 may be, for example, a propagated data signal containing program code 980. For example, computer readable signal media 986 may be an electromagnetic signal, an optical signal, and/or any other suitable type of signal. These signals may be transmitted over communications links, such as wireless communications links, optical fiber cable, coaxial cable, a wire, and/or any other suitable type of communications link. In other words, the communications link and/or the connection may be physical or wireless in the illustrative examples.

In some illustrative embodiments, program code 980 may be downloaded over a network to persistent storage 972 from another device or data processing system through computer readable signal media 986 for use within controller 90. For instance, program code stored in a computer readable storage medium in a server data processing system may be downloaded over a network from the server to controller 90. The data processing system providing program code 980 may be a server computer, a client computer, or some other device capable of storing and transmitting program code 980.

The different components illustrated for controller 90 are not meant to provide architectural limitations to the manner in which different embodiments may be implemented. The different illustrative embodiments may be implemented in a data processing system including components in addition to and/or in place of those illustrated for controller 90. Other components shown in FIG. 1 can be varied from the illustrative examples shown. The different embodiments may be implemented using any hardware device or system adapted, configured, designed, constructed, and or programmed to run program code 980. As one example, controller 90 may include organic components integrated with inorganic components and/or may be comprised entirely of organic components excluding a human being. For example, a storage device may be comprised of an organic semiconductor.

In another illustrative example, processor unit 968 may take the form of a hardware unit that has circuits that are manufactured or configured for a particular use. This type of hardware may perform operations without needing program code to be loaded into a memory from a storage device to be configured to perform the operations.

For example, when processor unit 968 takes the form of a hardware unit, processor unit 968 may be a circuit system, an application specific integrated circuit (ASIC), a programmable logic device, or some other suitable type of hardware configured to perform a number of operations. With a programmable logic device, the device is configured to perform the number of operations. The device may be reconfigured at a later time or may be permanently configured to perform the number of operations. Examples of programmable logic devices include, for example, a programmable logic array, a field programmable logic array, a field programmable gate array, and other suitable hardware devices. With this type of implementation, program code 980 may be omitted, because the processes for the different embodiments are implemented and/or embedded in a hardware unit.

In still another illustrative example, processor unit 968 may be implemented using a combination of processors found in computers and hardware units. Processor unit 968 may have a number of hardware units and a number of processors that are configured to run program code 980. With this example, some of the processes may be implemented and/or embedded in the number of hardware units, while other processes may be implemented in the number of processors.

In another example, a bus system may be used to implement communications framework 966 and may be comprised of one or more buses, such as a system bus or an input/output bus. Of course, the bus system may be implemented using any suitable type of architecture that provides for a transfer of data between different components or devices attached to the bus system.

Additionally, communications unit 974 may include a number of devices that transmit data, receive data, or both transmit and receive data. Communications unit 974 may be, for example, a modem or a network adapter, two network adapters, or some combination thereof. Further, communications unit 974 may include a memory that may be, for example, memory 970, or a cache, such as that found in an interface and memory controller hub that may be present in communications framework 966.

The flowcharts and block diagrams described herein illustrate the architecture, functionality, and operation of possible implementations of systems, methods, and computer program products according to various illustrative embodiments. In this regard, each block in the flowcharts or block diagrams may represent a module, segment, or portion of code, which comprises one or more executable instructions for implementing the specified logical function or functions. It should also be noted that, in some alternative implementations, the functions noted in a block may occur out of the order noted in the drawings. For example, the functions of two blocks shown in succession may be executed substantially concurrently, or the functions of the blocks may sometimes be executed in the reverse order, depending upon the functionality involved.

In the present disclosure, several of the illustrative, non-exclusive examples have been discussed and/or presented in the context of flow diagrams, or flow charts, in which the methods are shown and described as a series of blocks, or steps. Unless specifically set forth in the accompanying description, it is within the scope of the present disclosure that the order of the blocks may vary from the illustrated order in the flow diagram, including with two or more of the blocks (or steps) occurring in a different order and/or concurrently. It is also within the scope of the present disclosure that the blocks, or steps, may be implemented as logic, which also may be described as implementing the blocks, or steps, as logics. In some applications, the blocks, or steps, may represent expressions and/or actions to be performed by functionally equivalent circuits or other logic devices. The illustrated blocks may, but are not required to, represent executable instructions that cause a computer, processor, and/or other logic device to respond, to perform an action, to change states, to generate an output or display, and/or to make decisions.

As used herein, the term "and/or" placed between a first entity and a second entity means one of (1) the first entity, (2) the second entity, and (3) the first entity and the second entity. Multiple entities listed with "and/or" should be construed in the same manner, i.e., "one or more" of the entities so conjoined. Other entities may optionally be present other than the entities specifically identified by the "and/or" clause, whether related or unrelated to those entities specifically identified. Thus, as a non-limiting example, a reference to "A and/or B," when used in conjunction with open-ended language such as "comprising" may refer, in one embodiment, to A only (optionally including entities other than B); in another embodiment, to B only (optionally including entities other than A); in yet another embodiment, to both A and B (optionally including other entities). These entities may refer to elements, actions, structures, steps, operations, values, and the like.

As used herein, the phrase "at least one," in reference to a list of one or more entities should be understood to mean at least one entity selected from any one or more of the entity in the list of entities, but not necessarily including at least one of each and every entity specifically listed within the list of entities and not excluding any combinations of entities in the list of entities. This definition also allows that entities may optionally be present other than the entities specifically identified within the list of entities to which the phrase "at least one" refers, whether related or unrelated to those entities specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including entities other than B); in another embodiment, to at least one, optionally including more than one, B, with no A present (and optionally including entities other than A); in yet another embodiment, to at least one, optionally including more than one, A, and at least one, optionally including more than one, B (and optionally including other entities). In other words, the phrases "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" may mean A alone, B alone, C alone, A and B together, A and C together, B and C together, A, B and C together, and optionally any of the above in combination with at least one other entity.

In the event that any patents, patent applications, or other references are incorporated by reference herein and (1) define a term in a manner that is inconsistent with and/or (2) are otherwise inconsistent with, either the non-incorporated portion of the present disclosure or any of the other incorporated references, the non-incorporated portion of the present disclosure shall control, and the term or incorporated disclosure therein shall only control with respect to the reference in which the term is defined and/or the incorporated disclosure was present originally.

As used herein the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa.

As used herein, the phrase, "for example," the phrase, "as an example," and/or simply the term "example," when used with reference to one or more components, features, details, structures, embodiments, and/or methods according to the present disclosure, are intended to convey that the described component, feature, detail, structure, embodiment, and/or method is an illustrative, non-exclusive example of components, features, details, structures, embodiments, and/or methods according to the present disclosure. Thus, the described component, feature, detail, structure, embodiment, and/or method is not intended to be limiting, required, or exclusive/exhaustive; and other components, features, details, structures, embodiments, and/or methods, including structurally and/or functionally similar and/or equivalent components, features, details, structures, embodiments, and/or methods, are also within the scope of the present disclosure.

Illustrative, non-exclusive examples of systems and methods according to the present disclosure are presented in the following enumerated paragraphs. It is within the scope of the present disclosure that an individual step of a method recited herein, including in the following enumerated paragraphs, may additionally or alternatively be referred to as a "step for" performing the recited action.

A1. A method of electrically testing electromigration in an electromigration test structure with a test system that includes a voltage control portion and a current control portion, the method comprising:

providing a high-side signal to the electromigration test structure at a high-side signal electric current and a high-side signal voltage;

receiving a low-side signal from the electromigration test structure at a low-side signal voltage;

measuring a voltage difference between the high-side signal voltage and the low-side signal voltage;

measuring a magnitude of the high-side signal electric current;

regulating the high-side signal electric current, via the voltage control portion, to maintain the voltage difference at a voltage setpoint; and limiting the high-side signal electric current, via the current control portion, to maintain the high-side signal electric current below a threshold current value.

A2. The method of paragraph A1, wherein:

the method includes providing a power supply electric current from a power supply to a current regulating structure;

the regulating the high-side signal electric current includes providing a voltage control signal from the voltage control portion to the current regulating structure;

the limiting the high-side signal electric current includes providing a current control signal from the current control portion to the current regulating structure; and the method further includes limiting the power supply electric current, with the current control portion, to generate the high-side signal, wherein the limiting the power supply electric current is based, at least in part, on the voltage control signal and on the current control signal.

A3. The method of paragraph A2, wherein the limiting the power supply electric current includes at least one of:

(i) increasing the high-side signal electric current responsive to the voltage difference being less than the threshold voltage difference; and (ii) decreasing the high-side signal electric current responsive to the voltage difference being greater than the threshold voltage difference.

A4. The method of any of paragraphs A2-A3, wherein the limiting the power supply electric current includes decreasing the high-side signal electric current responsive to the magnitude of the high-side signal electric current being greater than the threshold current value.

A5. The method of any of paragraphs A1-A4, wherein the regulating the high-side signal electric current includes at least one of:

(i) increasing the high-side signal electric current responsive to the voltage difference being less than the voltage setpoint; and (ii) decreasing the high-side signal electric current responsive to the voltage difference being greater than the voltage setpoint.

A6. The method of any of paragraphs A1-A5, wherein the limiting the high-side signal electric current includes decreasing the high-side signal electric current responsive to the high-side signal electric current being greater than the threshold current value.

A7. The method of any of paragraphs A1-A6, wherein the providing the high-side signal, the receiving the low-side signal, the measuring the voltage difference, and the measuring the high-side signal electric current are performed at least partially concurrently.

A8. The method of any of paragraphs A1-A7, wherein the providing the high-side signal and the receiving the low-side signal are performed at least substantially continuously during the measuring the voltage difference, the measuring the magnitude of the high-side signal electric current, the regulating the high-side signal electric current, and the limiting the high-side signal electric current.

A9. The method of any of paragraphs A1-A8, wherein the regulating the high-side signal electric current includes adjusting a magnitude of the high-side signal electric current that is provided during the providing the high-side signal to the electromigration test structure.

A10. The method of any of paragraphs A1-A9, wherein the limiting the high-side signal electric current includes adjusting a/the magnitude of the high-side signal electric current that is provided during the providing the high-side signal to the electromigration test structure.

A11. The method of any of paragraphs A1-A10, wherein, during the providing the high-side signal, the method further includes generating an electric current database of the magnitude of the high-side signal electric current as a function of time.

A12. The method of any of paragraphs A1-A11, wherein, during the providing the high-side signal, the method further includes generating a voltage database of the voltage difference as a function of time.

A13. The method of any of paragraphs A11-A12, wherein the method further includes at least one of:

(i) analyzing a/the electric current database to quantify electromigration in the electromigration test structure;

(ii) analyzing a/the voltage database to quantify electromigration in the electromigration test structure; and (iii) analyzing both the electric current database and the voltage database to quantify electromigration in the electromigration test structure.

A14. Non-transitory computer readable storage media including computer-executable instructions that, when executed, direct a test system to perform the method of any of paragraphs A1-A13.

B1. A test system for electrically testing electromigration in an electromigration test structure, the test system comprising:

a voltage control portion configured to receive a voltage setpoint signal and to generate a voltage control signal based on the voltage setpoint signal;

a current control portion configured to receive a current setpoint signal and to generate a current control signal based on the current setpoint signal;

a current regulating structure configured to receive a power supply electric current from a power supply, to receive the voltage control signal, to receive the current control signal, and to generate a high-side signal from the power supply electric current, wherein the high-side signal has a high-side signal voltage and a high-side signal electric current, and further wherein the current regulating structure regulates the high-side signal electric current based upon both the voltage control signal and the current control signal;

an electric current detector configured to measure a magnitude of the high-side signal electric current and to generate a detected current signal that is based upon the magnitude of the high-side signal electric current;

a first system connection configured to receive the high-side signal, to electrically contact a first test connection of the electromigration test structure, and to provide the high-side signal to the first test connection;

a second system connection configured to electrically contact a second test connection of the electromigration test structure and to receive a low-side signal from the second test connection;

a voltage detector configured to measure a voltage difference between the high-side signal and the low-side signal and to generate a detected voltage signal that is based upon the voltage difference; and a controller configured to receive the detected current signal, to receive the detected voltage signal, to generate the voltage setpoint signal, and to generate the current setpoint signal; wherein the controller is programmed to:

(i) selectively control the voltage setpoint signal to maintain the voltage difference at a voltage setpoint; and (ii) selectively control the current setpoint signal to maintain the high-side signal electric current below a threshold current value.

B2. The system of paragraph B1, wherein the controller is programmed to increase the current setpoint signal to a current setpoint value, which corresponds to the threshold current value, prior to initiating supply of the high-side signal to at least one of:
  (i) the first system connection; and
  (ii) the first test connection.

B3. The system of paragraph B2, wherein the controller is programmed to incrementally increase the current setpoint signal from an initial current setpoint signal value to the current setpoint value.

B4. The system of any of paragraphs B2-B3, wherein, subsequent to the current setpoint signal being increased to the current setpoint value, the controller is programmed to at least one of:
  (i) initiate supply of the high-side signal to the first system connection by increasing the voltage setpoint signal to a voltage setpoint value; and
  (ii) initiate supply of the high-side signal to the first test connection by increasing the voltage setpoint signal to a voltage setpoint value.

B5. The system of paragraph B4, wherein the controller is programmed to incrementally, and optionally linearly, increase the voltage setpoint signal from an initial voltage setpoint signal value to the voltage setpoint value.

B6. The system of any of paragraphs B1-B5, wherein the voltage control portion includes a voltage gain amplifier configured to receive the voltage setpoint signal and to generate an amplified voltage setpoint signal.

B7. The system of paragraph B6, wherein the voltage control portion further includes a voltage offset adjustment amplifier configured to receive the amplified voltage setpoint signal and the detected voltage signal, to compare the amplified voltage setpoint signal to the detected voltage signal, and to generate the voltage control signal based upon the comparison of the amplified voltage setpoint signal to the detected voltage signal.

B8. The system of paragraph B7, wherein the voltage offset adjustment amplifier is configured to at least one of:
  (i) modify the voltage control signal to increase the magnitude of the high-side signal electric current responsive to the detected voltage signal being less than the amplified voltage setpoint signal; and
  (ii) modify the voltage control signal to decrease the magnitude of the high-side signal electric current responsive to the detected voltage signal being greater than the amplified voltage setpoint signal.

B9. The system of any of paragraphs B1-B8, wherein the current control portion includes a current offset adjustment amplifier configured to receive the current setpoint signal and the detected current signal, to compare the current setpoint signal to the detected current signal, and to generate a current offset signal based upon the comparison of the current setpoint signal to the detected current signal.

B10. The system of paragraph B9, wherein the current offset adjustment amplifier is configured to at least one of:
  (i) modify the current offset signal to increase the magnitude of the high-side signal electric current responsive to the detected current signal being less than the current setpoint signal; and
  (ii) modify the current offset signal to decrease the magnitude of the high-side signal electric current responsive to the detected current signal being greater than the current setpoint signal.

B11. The system of any of paragraphs B9-B10, wherein the current control portion further includes an integrator amplifier configured to integrate the current offset signal and to generate the current control signal based thereon.

B12. The system of any of paragraphs B1-B11, wherein the current regulating structure includes a current drive transistor configured to receive at least a fraction of the voltage control signal and the power supply electric current and to generate the high-side signal from the power supply electric current based, at least in part, on the voltage control signal.

B13. The system of paragraph B12, wherein the current drive transistor is configured to at least one of:
  (i) increase the magnitude of the high-side signal electric current responsive to an increase in the voltage control signal; and
  (ii) decrease the magnitude of the high-side signal electric current responsive to a decrease in the voltage control signal.

B14. The system of any of paragraphs B12-B13, wherein the current regulating structure further includes a base current stealing transistor configured to receive the current control signal and to regulate the fraction of the voltage control signal that is provided to the current drive transistor based, at least in part, on the current control signal.

B15. The system of paragraph B14, wherein the current regulating structure includes a voltage control signal conductor, which conveys the voltage control signal to the current drive transistor, and a base current stealing conductor, which extends between the voltage control signal conductor and the base current stealing transistor, wherein the base current stealing transistor is configured to selectively vary a resistance between the base current stealing conductor and a ground to regulate the fraction of the voltage control signal that is provided to the current drive transistor.

B16. The system of any of paragraphs B1-B15, wherein the system includes the power supply.

B17. The system of paragraph B16, wherein the power supply is a direct current power supply.

B18. The system of any of paragraphs B1-B17, wherein the electric current detector includes a sense resistor and a current measurement amplifier, which is configured to detect a voltage drop across the sense resistor and to generate the detected current signal based, at least in part, on the voltage drop across the sense resistor.

B19. The system of any of paragraphs B1-B18, wherein the voltage detector includes a voltage measurement amplifier configured to measure the voltage difference between the high-side signal and the low-side signal.

B20. The system of any of paragraphs B1-B19, wherein the voltage detector includes a first voltage connection in electrical communication with the first test connection and a second voltage connection in electrical communication with the second test connection, and further wherein the voltage detector is configured to measure a voltage difference between the first test connection and the second test connection.

B21. The system of any of paragraphs B1-B20, wherein the first system connection includes at least one of:
  (i) a first system probe;
  (ii) a first system needle probe;
  (iii) a first system rocking beam probe;
  (iv) a first system pin, and
  (v) a first system socket.

B22. The system of any of paragraphs B1-B21, wherein the second system connection includes at least one of:
  (i) a second system probe;
  (ii) a second system needle probe;

(iii) a second system rocking beam probe;
(iv) a second system pin, and
(v) a second system socket.

B23. The system of any of paragraphs B1-B22, wherein the second system connection is a grounded system connection.

B24. The system of any of paragraphs B1-B23, wherein the first voltage connection includes at least one of:
(i) a first voltage probe;
(ii) a first voltage needle probe;
(iii) a first voltage rocking beam probe;
(iv) a first voltage pin, and
(v) a first voltage socket.

B25. The system of any of paragraphs B1-B24, wherein the second voltage connection includes at least one of:
(i) a second voltage probe;
(ii) a second voltage needle probe;
(iii) a second voltage rocking beam probe;
(iv) a second voltage pin, and
(v) a second voltage socket.

B26. The system of any of paragraphs B1-B25, wherein the first test connection includes at least one of:
(ii) a first contact pad;
(ii) a first test pad;
(iii) a first solder ball;
(iv) a first test pin; and
(v) a first test socket.

B27. The system of any of paragraphs B1-B26, wherein the second test connection includes at least one of:
(i) a second contact pad;
(ii) a second test pad;
(iii) a first solder ball;
(iv) a second test pin; and
(v) a second test socket.

B28. The system of any of paragraphs B1-B27, wherein the electromigration test structure forms a portion of a device under test (DUT), and further wherein the DUT at least one of:
(i) is located on a semiconductor wafer that includes a plurality of DUTs;
(ii) is a singulated DUT;
(iii) is an unpackaged DUT; and
(iv) is a packaged DUT.

B29. The system of any of paragraphs B1-B28, wherein the controller is, or is instead, programmed to perform any suitable portion of any of the methods of any of paragraphs A1-A13 or C1-C11.

C1. A method of electrically testing electromigration in an electromigration test structure with a test system configured to provide a high-side signal to the electromigration test structure at a high-side signal electric current and at a high-side signal voltage and to receive a low-side signal from the electromigration test structure at a low-side signal voltage, wherein the test system includes a voltage control portion and a current control portion, wherein the voltage control portion and the current control portion collectively regulate the high-side signal electric current by controlling operation of a current regulating structure, the method comprising:
selecting one of a magnitude of the high-side signal electric current and a voltage difference between the high-side signal voltage and the low-side signal voltage as a primary control parameter for a given electrical test of a given electromigration test structure;
establishing a setpoint value for the primary control parameter;
selecting the other of the high-side signal electric current and the voltage difference as a compliant control parameter for the given electrical test;
establishing a threshold value for the compliant control parameter;
providing the high-side signal to the electromigration test structure;
receiving the low-side signal from the electromigration test structure;
measuring the voltage difference;
measuring the magnitude of the high-side signal electric current; and
automatically adjusting the high-side signal electric current to maintain the primary control parameter at the setpoint value while maintaining the compliant control parameter below the threshold value.

C2. The method of paragraph C1, wherein the automatically adjusting includes:
(i) increasing the high-side signal electric current, via the current regulating structure, responsive to the primary control parameter being less than the setpoint value;
(ii) decreasing the high-side signal electric current, via the current regulating structure, responsive to the primary control parameter being greater than the setpoint value; and
(iii) decreasing the high-side signal electric current, via the current regulating structure, responsive to the compliant control value being greater than the threshold value.

C3. The method of any of paragraphs C1-C2, wherein the method includes selecting the voltage difference as the primary control parameter and selecting the magnitude of the high-side signal electric current as the compliant control parameter.

C4. The method of paragraph C3, wherein the automatically adjusting includes adjusting the high-side signal electric current, via the voltage control portion, to maintain the voltage difference at the setpoint value.

C5. The method of any of paragraphs C3-C4, wherein the automatically adjusting includes limiting the high-side signal electric current, via the current control portion, to maintain the magnitude of the high-side signal electric current below the threshold value.

C6. The method of any of paragraphs C1-C2, wherein the method includes selecting the magnitude of the high-side signal electric current as the primary control parameter and selecting the voltage difference as the compliant control parameter.

C7. The method of paragraph C6, wherein the automatically adjusting includes adjusting the high-side signal electric current, via the current control portion, to maintain the magnitude of the high-side signal electric current at the setpoint value.

C8. The method of any of paragraphs C6-C7, wherein the automatically adjusting includes limiting the high-side signal electric current, via the voltage control portion, to maintain the voltage difference below the threshold value.

C9. The method of any of paragraphs C1-C8, wherein, during the providing the high-side signal, the method further includes generating an electric current database of the magnitude of the high-side signal electric current as a function of time.

C10. The method of any of paragraphs C1-C9, wherein, during the providing the high-side signal, the method further includes generating a voltage database of the voltage difference as a function of time.

C11. The method any of paragraphs C9-C10, wherein the method further includes at least one of:

(i) analyzing a/the electric current database to quantify electromigration in the electromigration test structure;

(ii) analyzing a/the voltage database to quantify electromigration in the electromigration test structure; and (iii) analyzing both the electric current database and the voltage database to quantify electromigration in the electromigration test structure.

C12. Non-transitory computer readable storage media including computer-executable instructions that, when executed, direct a test system to perform the method of any of paragraphs C1-C11.

INDUSTRIAL APPLICABILITY

The systems and methods disclosed herein are applicable to the semiconductor manufacturing and test industries.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower, or equal in scope to the original claims, are also regarded as included within the subject matter of the inventions of the present disclosure.

The invention claimed is:

1. A method of performing a constant-voltage electromigration test of an electromigration test structure utilizing a test system that includes a voltage control portion and a current control portion, the method comprising:
   providing a high-side signal to the electromigration test structure at a high-side signal electric current and a high-side signal voltage;
   receiving a low-side signal from the electromigration test structure at a low-side signal voltage;
   measuring a voltage difference between the high-side signal voltage and the low-side signal voltage;
   measuring a magnitude of the high-side signal electric current;
   regulating the high-side signal electric current, via the voltage control portion, to maintain the voltage difference at a voltage setpoint; and
   limiting the high-side signal electric current, via the current control portion, to maintain the high-side signal electric current below a threshold current value.

2. The method of claim 1, wherein:
   the method includes providing a power supply electric current from a power supply to a current regulating structure;
   the regulating the high-side signal electric current includes providing a voltage control signal from the voltage control portion to the current regulating structure;
   the limiting the high-side signal electric current includes providing a current control signal from the current control portion to the current regulating structure; and
   the method further includes limiting the power supply electric current, with the current control portion, to generate the high-side signal, wherein the limiting the power supply electric current is based, at least in part, on the voltage control signal and on the current control signal.

3. The method of claim 1, wherein the regulating the high-side signal electric current includes at least one of:
   (i) increasing the high-side signal electric current responsive to the voltage difference being less than the voltage setpoint; and
   (ii) decreasing the high-side signal electric current responsive to the voltage difference being greater than the voltage setpoint.

4. The method of claim 1, wherein the limiting the high-side signal electric current includes decreasing the high-side signal electric current responsive to the high-side signal electric current being greater than the threshold current value.

5. The method of claim 1, wherein the providing the high-side signal, the receiving the low-side signal, the measuring the voltage difference, and the measuring the high-side signal electric current are performed at least partially concurrently.

6. The method of claim 1, wherein the providing the high-side signal and the receiving the low-side signal are performed at least substantially continuously during the measuring the voltage difference, the measuring the magnitude of the high-side signal electric current, the regulating the high-side signal electric current, and the limiting the high-side signal electric current.

7. The method of claim 1, wherein, during the providing the high-side signal, the method further includes generating an electric current database of the magnitude of the high-side signal electric current as a function of time.

8. The method of claim 7, wherein, during the providing the high-side signal, the method further includes generating a voltage database of the voltage difference as a function of time.

9. The method of claim 8, wherein the method further includes at least one of:
   (i) analyzing the electric current database to quantify electromigration in the electromigration test structure;
   (ii) analyzing the voltage database to quantify electromigration in the electromigration test structure; and
   (iii) analyzing both the electric current database and the voltage database to quantify electromigration in the electromigration test structure.

10. Non-transitory computer readable storage media including computer-executable instructions that, when executed, direct a test system to perform the method of claim 1.

11. A test system for electrically testing electromigration in an electromigration test structure, the test system comprising:
   a voltage control portion configured to receive a voltage setpoint signal and to generate a voltage control signal based on the voltage setpoint signal;

a current control portion configured to receive a current setpoint signal and to generate a current control signal based on the current setpoint signal;

a current regulating structure configured to receive a power supply electric current from a power supply, to receive the voltage control signal, to receive the current control signal, and to generate a high-side signal from the power supply electric current, wherein the high-side signal has a high-side signal voltage and a high-side signal electric current, and further wherein the current regulating structure regulates the high-side signal electric current based upon both the voltage control signal and the current control signal;

an electric current detector configured to measure a magnitude of the high-side signal electric current and to generate a detected current signal that is based upon the magnitude of the high-side signal electric current;

a first system connection configured to receive the high-side signal, to electrically contact a first test connection of the electromigration test structure, and to provide the high-side signal to the first test connection;

a second system connection configured to electrically contact a second test connection of the electromigration test structure and to receive a low-side signal from the second test connection;

a voltage detector configured to measure a voltage difference between the high-side signal and the low-side signal and to generate a detected voltage signal that is based upon the voltage difference; and a controller configured to receive the detected current signal, to receive the detected voltage signal, to generate the voltage setpoint signal, and to generate the current setpoint signal;

wherein the controller is programmed to control the operation of the test system according to the method of claim 1.

12. The system of claim 11, wherein the controller is programmed to increase the current setpoint signal to a current setpoint value, which corresponds to the threshold current value, prior to initiating supply of the high-side signal to at least one of:
(i) the first system connection; and
(ii) the first test connection.

13. The system of claim 12, wherein, subsequent to the current setpoint signal being increased to the current setpoint value, the controller is programmed to at least one of:
(i) initiate supply of the high-side signal to the first system connection by increasing the voltage setpoint signal to a voltage setpoint value; and
(ii) initiate supply of the high-side signal to the first test connection by increasing the voltage setpoint signal to a voltage setpoint value.

14. The system of claim 11, wherein the current regulating structure includes a current drive transistor configured to receive at least a fraction of the voltage control signal and the power supply electric current and to generate the high-side signal from the power supply electric current based, at least in part, on the voltage control signal, and further wherein the current drive transistor is configured to at least one of:
(i) increase the magnitude of the high-side signal electric current responsive to an increase in the voltage control signal; and
(ii) decrease the magnitude of the high-side signal electric current responsive to a decrease in the voltage control signal.

15. The system of claim 14, wherein the current regulating structure further includes a base current stealing transistor configured to receive the current control signal and to regulate the fraction of the voltage control signal that is provided to the current drive transistor based, at least in part, on the current control signal.

16. A method of electrically testing electromigration in an electromigration test structure with a test system configured to provide a high-side signal to the electromigration test structure at a high-side signal electric current and at a high-side signal voltage and to receive a low-side signal from the electromigration test structure at a low-side signal voltage, wherein the test system includes a voltage control portion and a current control portion, wherein the voltage control portion and the current control portion collectively regulate the high-side signal electric current by controlling operation of a current regulating structure, the method comprising:
selecting one of a magnitude of the high-side signal electric current and a voltage difference between the high-side signal voltage and the low-side signal voltage as a primary control parameter for a given electrical test of a given electromigration test structure;
establishing a setpoint value for the primary control parameter;
selecting the other of the high-side signal electric current and the voltage difference as a compliant control parameter for the given electrical test;
establishing a threshold value for the compliant control parameter;
providing the high-side signal to the electromigration test structure;
receiving the low-side signal from the electromigration test structure;
measuring the voltage difference;
measuring the magnitude of the high-side signal electric current; and
automatically adjusting the high-side signal electric current to maintain the primary control parameter at the setpoint value while maintaining the compliant control parameter below the threshold value.

17. The method of claim 16, wherein the automatically adjusting includes:
(i) increasing the high-side signal electric current, via the current regulating structure, responsive to the primary control parameter being less than the setpoint value;
(ii) decreasing the high-side signal electric current, via the current regulating structure, responsive to the primary control parameter being greater than the setpoint value; and
(iii) decreasing the high-side signal electric current, via the current regulating structure, responsive to the compliant control value being greater than the threshold value.

18. The method of claim 16, wherein the method includes selecting the voltage difference as the primary control parameter and selecting the magnitude of the high-side signal electric current as the compliant control parameter, wherein the automatically adjusting includes adjusting the high-side signal electric current, via the voltage control portion, to maintain the voltage difference at the setpoint value, and further wherein the automatically adjusting includes limiting the high-side signal electric current, via the current control portion, to maintain the magnitude of the high-side signal electric current below the threshold value.

19. The method of claim 16, wherein the method includes selecting the magnitude of the high-side signal electric current as the primary control parameter and selecting the voltage difference as the compliant control parameter, wherein the automatically adjusting includes adjusting the high-side signal electric current, via the current control portion, to maintain the magnitude of the high-side signal electric current at the setpoint value, and further wherein the automatically adjusting includes limiting the high-side signal electric current, via the voltage control portion, to maintain the voltage difference below the threshold value.

20. The method of claim 16, wherein, during the providing the high-side signal, the method further includes generating an electric current database of the magnitude of the high-side signal electric current as a function of time and generating a voltage database of the voltage difference as a function of time, and further wherein the method further includes at least one of:
   (i) analyzing a/the electric current database to quantify electromigration in the electromigration test structure;
   (ii) analyzing a/the voltage database to quantify electromigration in the electromigration test structure; and
   (iii) analyzing both the electric current database and the voltage database to quantify electromigration in the electromigration test structure.

\* \* \* \* \*